(12) United States Patent
Iwamura et al.

(10) Patent No.: US 8,053,878 B2
(45) Date of Patent: Nov. 8, 2011

(54) SUBSTRATE, SEMICONDUCTOR DEVICE USING THE SAME, METHOD FOR INSPECTING SEMICONDUCTOR DEVICE, AND METHOD FOR MANUFACTURING SEMICONDUCTOR DEVICE

(75) Inventors: Hiroki Iwamura, Kanagawa (JP); Naoto Ozawa, Kanagawa (JP); Hiroshi Hirai, Kanagawa (JP)

(73) Assignee: Panasonic Corporation, Osaka (JP)

( * ) Notice: Subject to any disclaimer, the term of this patent is extended or adjusted under 35 U.S.C. 154(b) by 443 days.

(21) Appl. No.: 11/979,768

(22) Filed: Nov. 8, 2007

(65) Prior Publication Data

US 2008/0105964 A1 May 8, 2008

(30) Foreign Application Priority Data

Nov. 8, 2006 (JP) .............................. P.2006-303202

(51) Int. Cl.
 *H01L 23/488* (2006.01)
(52) U.S. Cl. ........ 257/686; 257/738; 257/755; 257/E21; 257/790; 257/791; 257/E23.021; 257/E23.069; 257/E21.508; 257/796; 438/18
(58) Field of Classification Search .................. 257/686, 257/738, 755, E21, 790, 791, E23.021, E23.069, 257/E21.508, 796; 438/18
See application file for complete search history.

(56) References Cited

U.S. PATENT DOCUMENTS

| 6,914,259 | B2 | 7/2005 | Sakiyama et al. | |
|---|---|---|---|---|
| 7,041,513 | B2 | 5/2006 | Akram | |
| 7,445,962 | B2* | 11/2008 | Choi et al. | 438/109 |
| 2004/0178508 | A1* | 9/2004 | Nishimura et al. | 257/778 |
| 2005/0006784 | A1 | 1/2005 | Nakayama | |
| 2005/0139988 | A1* | 6/2005 | Ishida | 257/700 |
| 2005/0263759 | A1* | 12/2005 | Shiozawa | 257/48 |
| 2006/0131719 | A1 | 6/2006 | Nakayama | |
| 2007/0254404 | A1* | 11/2007 | Gerber et al. | 438/109 |

FOREIGN PATENT DOCUMENTS

| JP | 2003-133510 | 5/2003 |
|---|---|---|
| JP | 2004-363126 | 12/2004 |
| JP | 2005-302871 | 10/2005 |
| JP | 2006-344789 | 12/2006 |

* cited by examiner

*Primary Examiner* — Wael Fahmy
*Assistant Examiner* — Marc Armand
(74) *Attorney, Agent, or Firm* — McDermott Will & Emery LLP

(57) ABSTRACT

A substrate including therein a plurality of conductor layers laminated via insulating layers, the substrate mounting at least one semiconductor integrated circuit, wherein the substrate includes a first electrode terminal connected to the semiconductor integrated circuit, a second electrode terminal connected to a terminal on an upper substrate arranged in a layer over the substrate, and on at least part of the perimeter of the first and second electrode terminals, a third electrode terminal located outside the outer edge of the upper substrate.

13 Claims, 10 Drawing Sheets

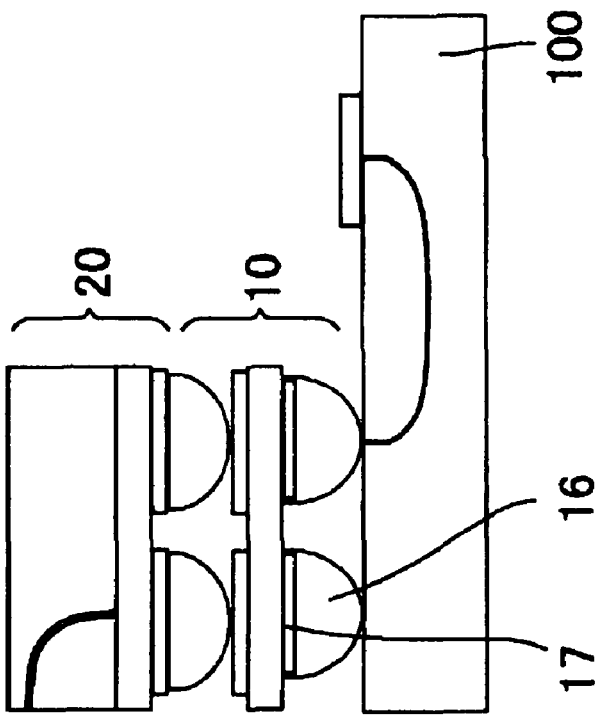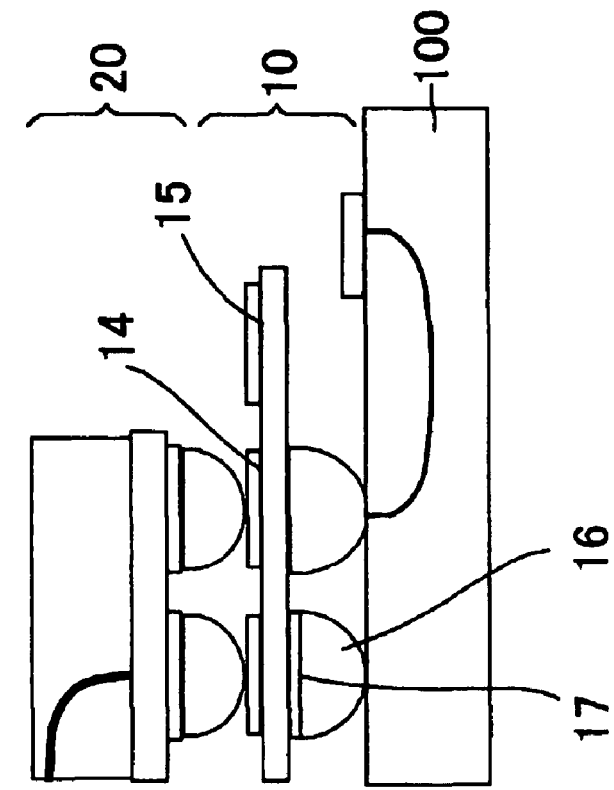

FIG. 8
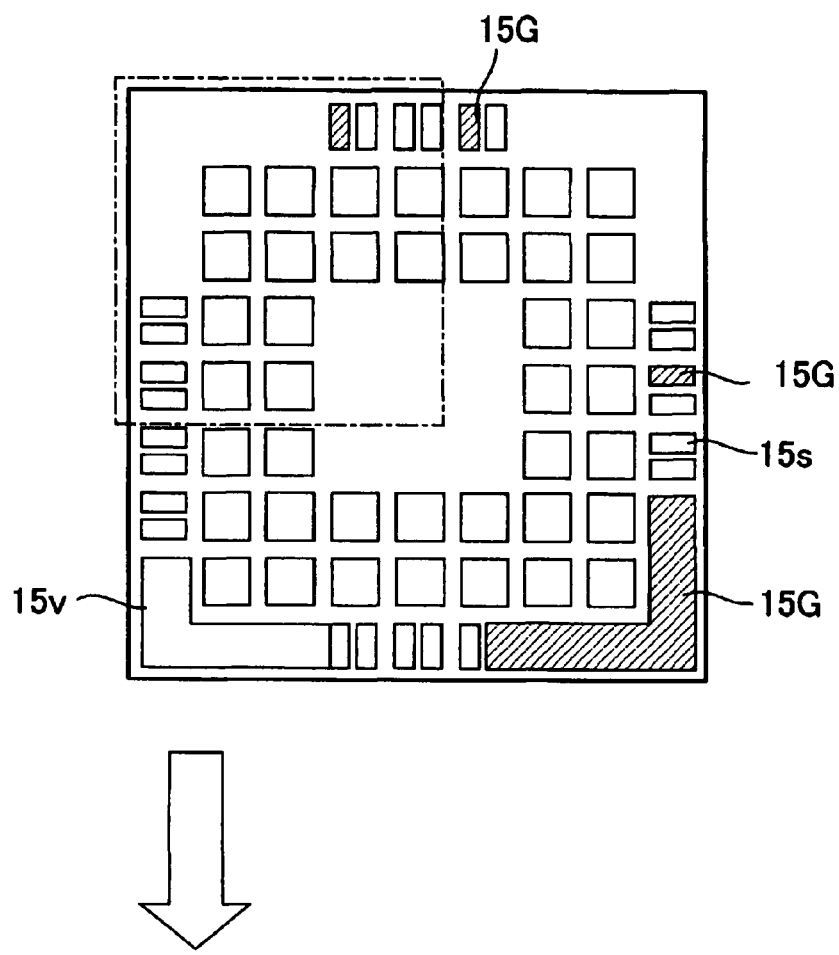
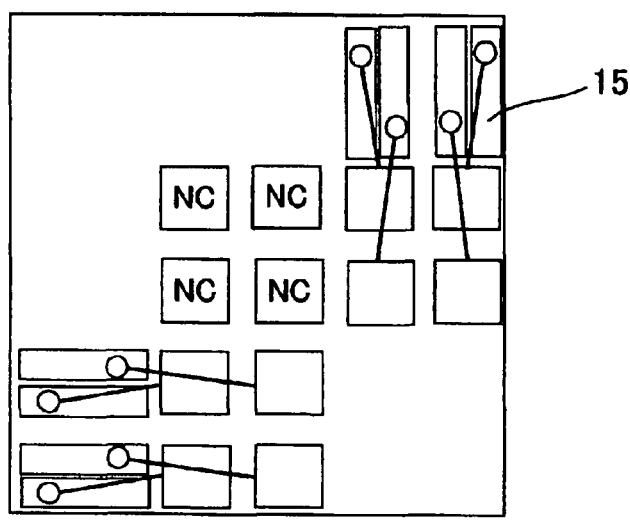

SUBSTRATE, SEMICONDUCTOR DEVICE USING THE SAME, METHOD FOR INSPECTING SEMICONDUCTOR DEVICE, AND METHOD FOR MANUFACTURING SEMICONDUCTOR DEVICE

BACKGROUND OF THE INVENTION

1. Field of the Invention

The present invention relates to a substrate, a semiconductor device using the same, a method for inspecting semiconductor device, and a method for manufacturing semiconductor device, and in particular to terminal arrangement on a substrate.

2. Description of the Related Art

With a demand for ever-shrinking electronic components, it is necessary to mount a large number of integrated circuit chips and circuit components on a semiconductor device mounting a semiconductor integrated circuit and circuit components. There is a growing demand for efficient use of a wiring space and a component mounting space.

There is proposed for example a laminated semiconductor device that has improved the conforming product rate with reduced mounting area per function or memory capacity (Patent Reference 1).

On this semiconductor device, a semiconductor chip is mounted face down on the main surface of a first substrate including a bonding pad arranged along the edge of the main surface of the substrate so as to expose the first bonding pad. A test is conducted using the first bonding pad to determine whether the semiconductor device is non-defective. Further, a second substrate mounting a second semiconductor chip having a similarly formed second bonding pad is mounted on the first substrate so as to expose the first bonding pad. The first and second semiconductor chips are connected to the outside by using the first and second bonding pads.

As such a semiconductor device becomes highly integrated, the number of pins goes on rising increasingly. These first and second bonding pads are not sufficient for connection. Surface mounting has been proposed using a so-called solder ball whereby substrates are interconnected via a surface contact.

For example, as shown in FIG. 11, a so-called Package on Package (PoP) has been proposed that is formed by laminating an SoC 1010 formed by horizontal mounting on a mounting substrate and a memory device 1020 as shown in FIG. 12.

Such a laminated semiconductor device reduces the mounting area as the signal wiring length. This accordingly reduces the signal wiring capacity and possible noise.

In recent years, a system design called System on Chip (SoC) has been in widespread use that integrates complicated functional macros into a single LSI. Here, the "functional macro" is a concept mainly used in the functional design stage of LSI. The functional macro refers to a single cell (block) as aggregation of circuits to implement a predetermined function and is registered in a library in the form of an IP (design resource). To form a laminated semiconductor device using such a high-integration LSI, in particular, interconnection between the first semiconductor chip mounted on the first substrate and the second semiconductor chip mounted on the second substrate is required although there arises a problem that interconnection via the first or second substrate results in failure to measure signals.

In particular, a system on chop using a high-frequency LSI used in a frequency band over 100 MHz is intended for high-speed transmission so that waveform rounding is strictly unacceptable. A delay attributable the wiring length on a substrate or wiring length to a test circuit as well as attenuation or problem with matching caused by a connection terminal such as an electrode pad are serious. Measures have been taken so that the wiring length will be minimized and the wiring capacity will be reduced. Under these circumstances, a downsized and lower-profile substrate and reduction of the number of pins and the number of conductor layers present major problems.

There are many cases where it is necessary to mount a filter component or a bypass capacitor. In case such an external component is mounted on a mounting substrate, a wiring resistance caused by the length of wiring is serious.

In this way, with a substrate that mounts semiconductor integrated circuit chips in a laminated layer structure, routing of wiring must be minimized and the impedance caused by the wiring itself must be reduced.

Each of the functional macros has a separate circuit scale and operation as well as the number of test patters required for testing. The result is a heavy load on an LSI tester. It is an important challenge to efficiently conduct the test of each functional macro.

In this way, it is one of the important challenges to efficiently conduct the test of each functional macro. With the related art laminated semiconductor device shown in FIG. 12, the second semiconductor chip is connected to the outside via the second and first substrates. This may trigger a drop in the efficiency of the test of the entire LSI including the other functional macros.

Patent Reference 1: JP-A-2005-302871

SUMMARY OF THE INVENTION

The invention has been accomplished in view of the foregoing circumstances. An object of the invention is to provide a reliable semiconductor device used in a high-frequency band that is compact in side and less influenced by noise.

Another object of the invention is to provide a semiconductor device that allows a high-accuracy test to be conducted with easy and workability and that is free from waveform rounding and offers a high conforming product rate.

The invention provides a substrate comprising therein a plurality of conductor layers laminated via insulating layers, the substrate mounting at least one semiconductor integrated circuit, wherein the substrate includes a first electrode terminal connected to the semiconductor integrated circuit, a second electrode terminal connected to a terminal on an upper substrate arranged in a layer over the substrate, and on at least part of the perimeter of the first and second electrode terminals, a third electrode terminal located outside the outer edge of the upper substrate.

With this configuration, it is possible to conduct a test using the third electrode terminal exposed even after the upper substrate is laminated thereon thus reducing the wiring length. This prevents an unnecessary increase in the wiring capacity makes it possible to provide a reliable semiconductor device. By mounting conforming components after a high-accuracy inspection process dramatically improves manufacturing yields.

The invention provides a laminated semiconductor device comprising a substrate mounting a first semiconductor integrated circuit and an upper substrate mounting a second semiconductor integrated circuit laminated thereon, wherein the substrate is designed to mount the first semiconductor integrated circuit and includes therein a plurality of conductor layers laminated via insulating layers, a first electrode terminal connected to the semiconductor integrated circuit, a second electrode terminal connected to a terminal on an upper substrate arranged in a layer over the substrate, and on at least part of the perimeter of the first and second electrode terminals, a third electrode terminal located outside the outer edge of the upper substrate, and wherein the upper substrate is electrically connected to the third electrode terminal on the substrate via the second electrode terminal.

With this configuration, the third electrode terminal is arranged outside the upper substrate. It is thus possible to perform an inspection with ease by using the third electrode terminal, without the intervention of a substrate or a mounting substrate. It is thus possible to detect a high-accuracy signal without noise in a high-frequency band also, thereby improving the inspection accuracy.

A method for inspecting a semiconductor device according to the invention inspects the signal characteristics outputted via a substrate by causing a probe to come into contact with the third electrode terminal on the substrate and testing the substrate mounting the first semiconductor integrated circuit.

The invention provides a method for manufacturing a semiconductor device, comprising steps of: temporarily connecting an upper substrate mounting a second semiconductor integrated circuit to the second electrode terminal on a substrate mounting a first semiconductor integrated circuit; inspecting the substrate mounting the second semiconductor integrated circuit by causing a probe to come into contact with the third electrode terminal on the first substrate; and finally connecting the upper substrate mounting the second semiconductor integrated circuit so as to establish electrical connection via the second electrode terminal on the upper substrate determined acceptable in the inspecting step.

With this configuration, an inspection process is executed where a high-accuracy signal output is obtained by detecting signal characteristics outputted via substrates while the substrates are laminated. Only a substrate that has passed the inspection is mounted. This conducts a high-accuracy signal characteristic test without unnecessarily delivering a nonconforming product. This allows mounting that is based on the high-accuracy inspection result thus enhancing yields.

With the invention, it is possible to perform a highly accurate inspection with ease on a laminated semiconductor device used especially in a high-frequency band. The mounting area and signal wiring capacity are reduced, together with the reduction of noise.

In a process where a plurality of substrates (a substrate and an upper substrate) each mounting a semiconductor integrated circuit designed to perform signal processing of high-frequency signals such as a multi-carrier signal are laminated to form a semiconductor device, it is possible to minimize the increase in the inductance caused by an increase in the distance between the substrates (the substrate and the upper substrate) in the direction of thickness without increasing the mounting area even in the presence of a large number of pins.

BRIEF DESCRIPTION OF THE DRAWINGS

FIG. 5 is an enlarged view of the key parts of a circuit module according to Embodiment 1 of the invention.

FIG. 8 shows the key parts of a substrate according to Embodiment 3 of the invention.

DESCRIPTION OF THE PREFERRED EMBODIMENTS

Embodiments of the invention will be detailed referring to drawings.

Embodiment 1

Figure 1:
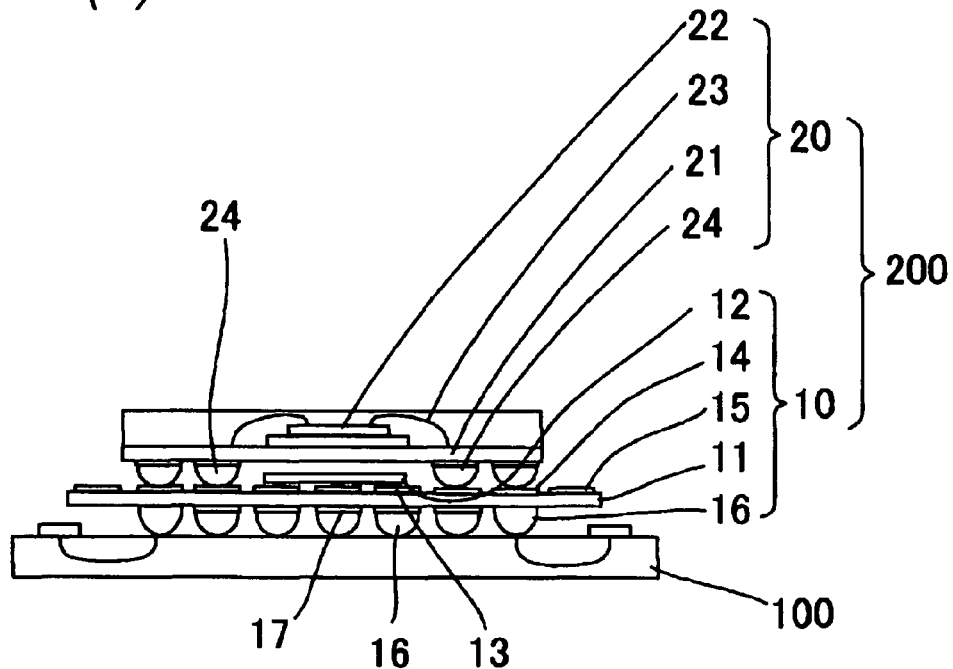
FIG. 1 shows a circuit module according to Embodiment 1 of the invention.
Figure 1:
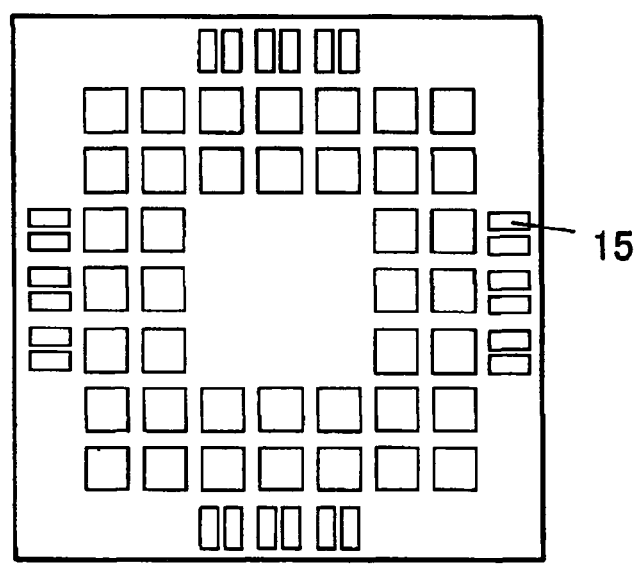
Figure 4:
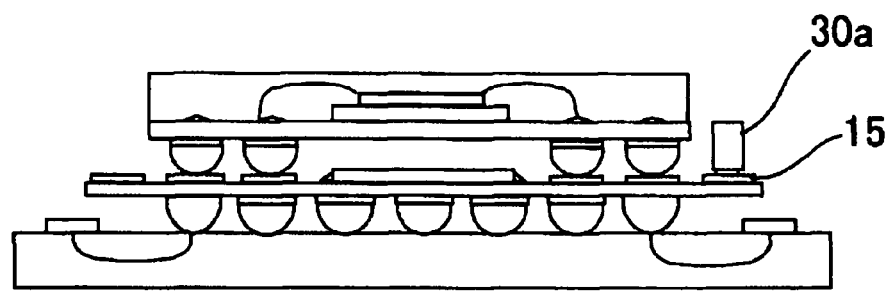
FIG. 4 is an exploded perspective view of a semiconductor integrated circuit according to Embodiment 1 of the invention.
Figure 4:
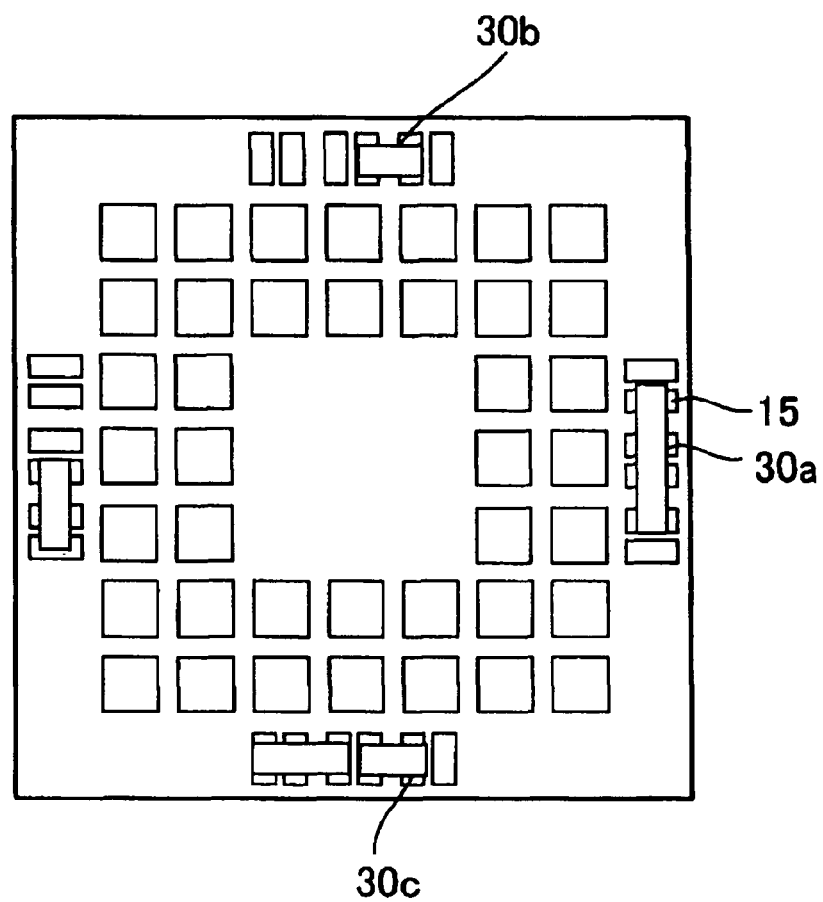

As shown in the cross-sectional view of FIG. 1, a semiconductor integrated circuit device according to Embodiment 1 of the invention includes: a first module 10 where a first semiconductor integrated circuit chip 12 called SoC (system on chip) as an integration of functional macros is mounted on a first substrate 11 composed of laminated substrate having three layers of wiring patterns; and a second module 20 where a second semiconductor integrated circuit chip 22 as a memory is mounted on a second substrate (upper substrate) 21; the second module 20 laminated on the first module 10; altogether constituting a laminated-structure circuit module 200. The semiconductor integrated circuit device includes, on the perimeter of the first substrate of the first module 10, a thirst electrode terminal 15 exposed outside the outer edge of the second substrate. The third electrode terminal 15 is used as a terminal working as an inspection probe. In the final stage, an external component 30a (refer to FIG. 4(a)) such as a filter or a bypass capacitor may be mounted on the third electrode terminal 15.

Figure 2:
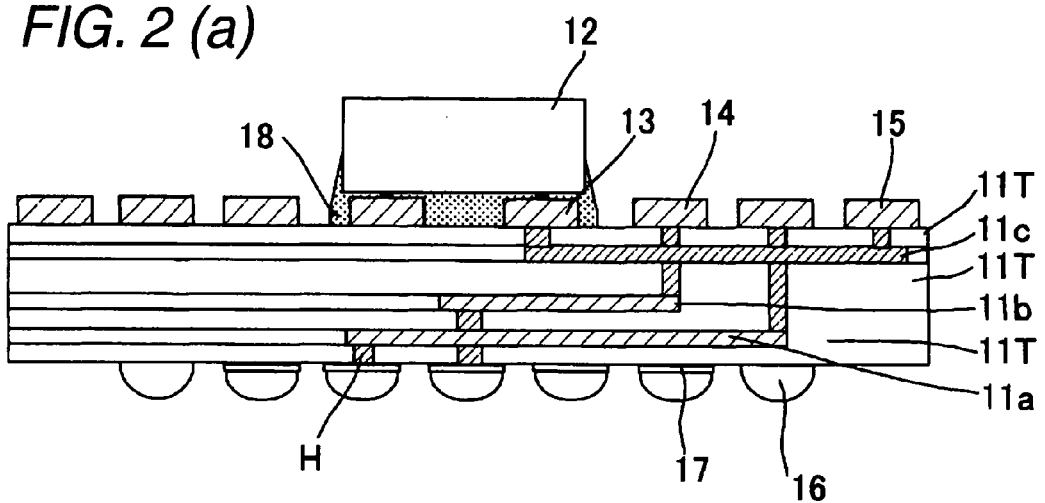
FIG. 2 shows a first module constituting the circuit module according to Embodiment 1 of the invention.
Figure 2:
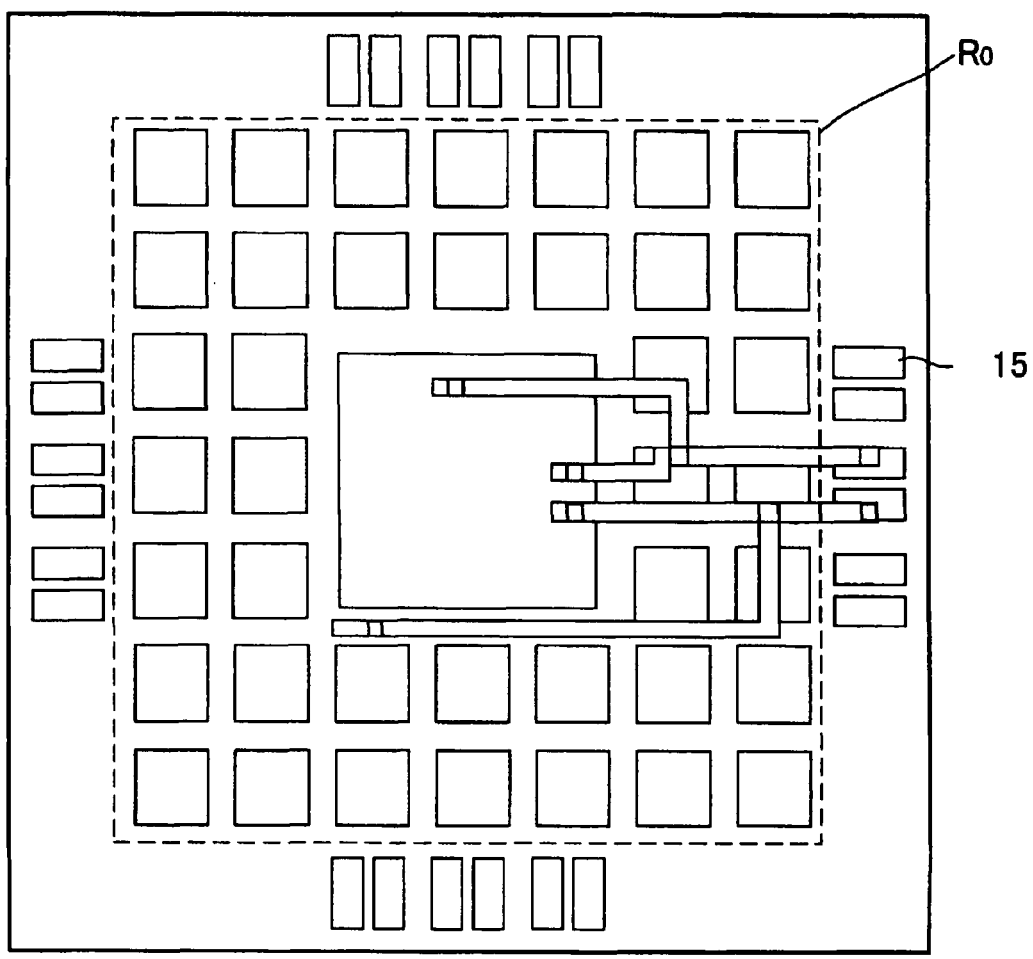

FIG. 2(a) is a key part explanatory drawing of the first module 10. FIG. 2(b) is a top view of the first substrate of the first module 10. The first substrate includes first through third conductor layers 11a through 11c laminated via insulating layers 11T. The conductor layers are interconnected through the medium of a via contact H to form a desired circuit.

The first substrate is formed of film carriers on which a wiring pattern typically made of a conductor layer is formed are laminated via an insulating adhesive. The conductor layers are interconnected through the medium of the via contact H. On the uppermost surface are led out first through third electrode terminals 13, 14, 15 made of aluminum pads through the medium of the via contact H. In this example, the film carrier and the insulating adhesive are shown as an insulating layer 11T. On the lowermost surface is led out a fourth connection terminal 16 made of a solder ball and the connection terminal 16 is connected to a mounting substrate 100. In this example, the connection terminal 16 is connected to the wiring pattern (not shown) of the mounting substrate 100 by way of thermo-compression bonding.

On the outermost surface (front surface) of the first substrate 10 are formed the first electrode terminal 13 mounting the first semiconductor integrated circuit chip 12, the second electrode terminal 14 connected to the electrode terminal on the second module 20, and the third electrode terminal 15 separately formed outside these circuits. The third electrode terminal 15 is arranged outside an area corresponding to the outer edge $R_0$ of the upper substrate. On the rear surface of the first substrate is arranged the fourth connection terminal 16 made of a solder ball formed to connect to a pad 17 connecting to the conductor layer 11a. The connection terminal 16 provides connection to the mounting substrate 100. The first semiconductor integrated circuit chip 12 is connected face down to the first electrode terminal 13 and covered with a thermosetting resin 18.

The second semiconductor is composed of layered substrates similar to the first substrate. The second substrate 21 also includes a plurality of conductor layers laminated via insulating layers and the conductor layers are interconnected to constitute a desired circuit through the medium of the via contact H. On the front surface of the second substrate is arranged a pad punting the second semiconductor integrated circuit chip 22. The pad is connected via a bonding wire 23 by way of wire bonding and connected to an electrode terminal 24 on the rear surface through the medium of a via contact. The electrode terminal 24 is connected to the second electrode terminal 14 of the first module 10 located below. The third electrode terminal 15 includes an unconnected inspecting terminal that is open to an external terminal for connecting an electronic component such as a filter or a bypass capacitor (such as 30a, 30b, 30c in FIG. 4), that is, a terminal left unconnected.

Figure 3:
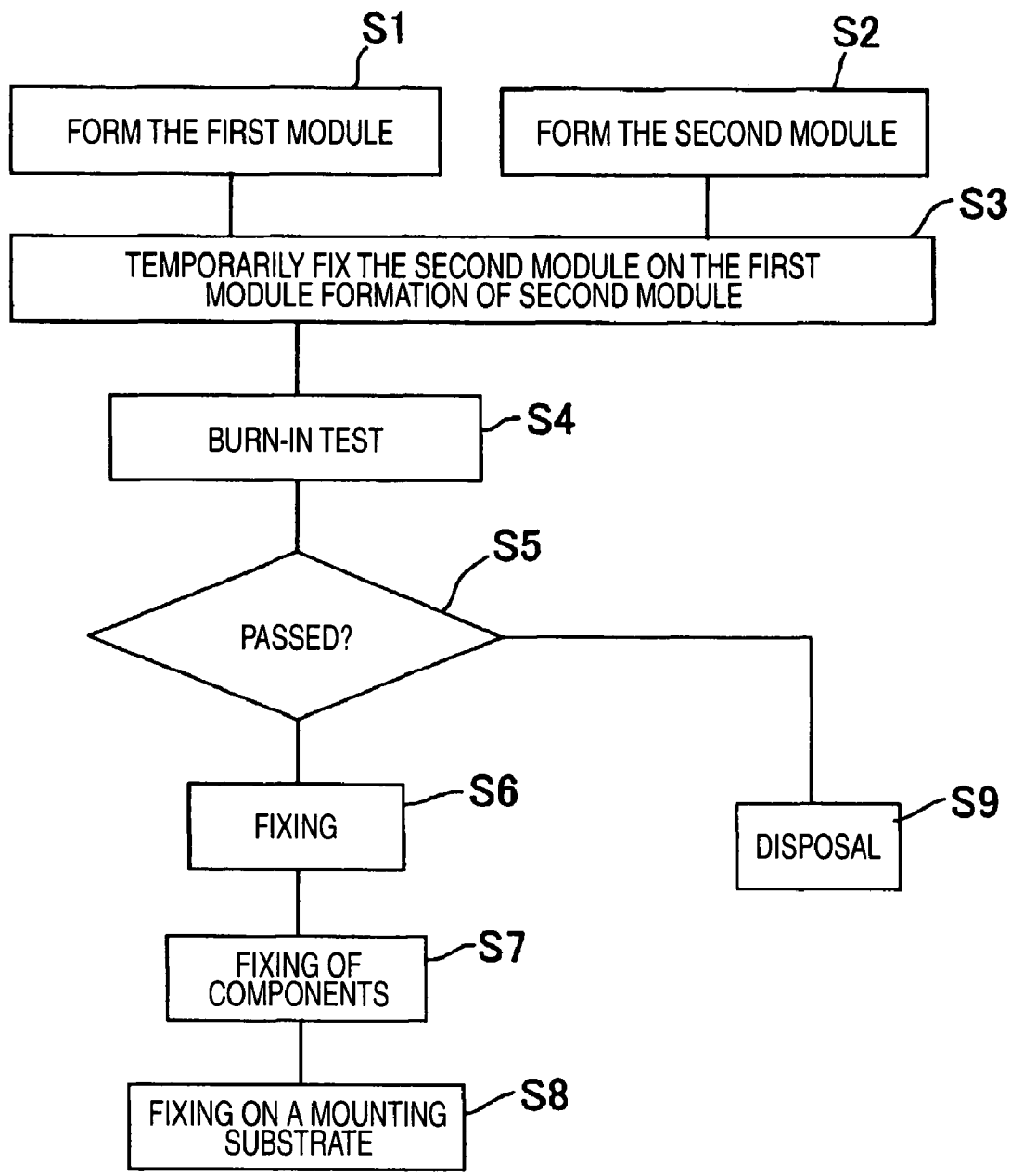
FIG. 3 is a flowchart showing the manufacturing process of the circuit module according to Embodiment 1 of the invention.

A process for manufacturing the semiconductor module will be described referring to FIG. 3

The first and second modules are formed (step S1, step S2).

The second module is laid on the first module and is temporarily fixed thereto (step S3).

An inspecting probe is applied to the third electrode terminal 15 and tests such as a signal characteristic test are conducted (step S4).

It is determined whether the test is passed (step S5).

In case it is determined that the test is passed in the determination step S5, heat is applied until the solder melting temperature. The second nodule 20 is fixed to the first module 10 (step S6).

As shown in FIGS. 4(a) and 4(b), the third electrode terminal 15 is used to fix a filter 30a, a bypass capacitor 30b and an amplifier 30c (step S7).

The circuit module 200 thus formed is laid on the mounting substrate 100 and is fixed thereto via a solder ball (step S8).

In case the test is not passed, the second module is disposed of (step S9).

In the above method, fixing of the first and second modules 10, 20 and fixing of the filter 30a, the bypass capacitor 30b and the amplifier 30c may be made using the same heating process.

In this way, the output of the second module is extracted from the first module via the third electrode terminal followed by a characteristic test. This eliminates an unnecessary wiring capacity and makes it possible to detect the real signal status as well as conduct a high-accuracy test. It is also possible to detect any nonconforming product before fixing the first and second modules. This allows the first module to remain used thus enhancing manufacturing yields. The first module may be inspected before laminating the second module.

FIGS. 5(a) and 5(b) show comparison between the invention and the circuit module of the comparison example. As shown in FIG. 5(a), in the circuit module of the invention, a third electrode terminal is arranged outside the second electrode terminal as a terminal for connection to the second module in the upper layer, that is, in the perimeter land. The third electrode terminal is used as an extracting terminal for the second module or an inspecting terminal in order to shorten the signal wiring. That is, in the case of the comparison example shown in FIG. 5(b), the third electrode terminal is omitted and connection is made to the mounting substrate 100 via the fourth connection terminal 16 of the first substrate and an inspecting probe is applied to the mounting substrate 100. A pad 17 is connected to the fourth connection terminal 16 arranged to the right in FIG. 5(b) and the connection terminal 16 is electrically connected to the second semiconductor integrated circuit device in the upper layer. In the case of the invention, signal wiring may be dramatically shortened. While an electronic component such as a filter or a bypass capacitor is mounted on the mounting substrate 100 in the related art, which results in a longer wiring length from the second module 20 that mounts a memory thus causing noise, connection is made via the third electrode terminal on the first substrate thus avoiding influences of noise from the mounting substrate in the invention.

While the fourth connection terminal is composed of a solder ball in the foregoing embodiment, a bump or an anisotropic conductive film may be used instead of a solder ball to connect to the lower substrate.

Embodiment 2

Embodiment 2 of the invention will be described.

Figure 6:
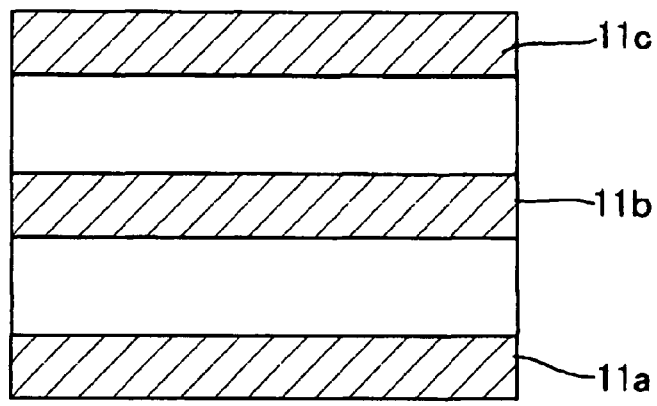
FIG. 6 shows a circuit module according to Embodiment 2 of the invention.
Figure 6:
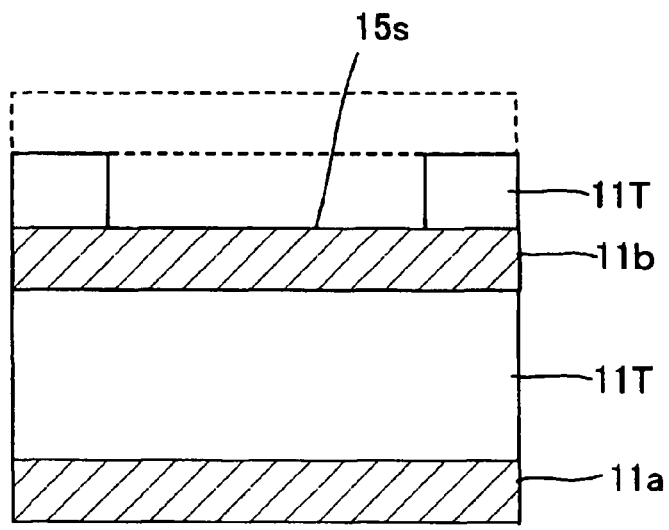
Figure 6:
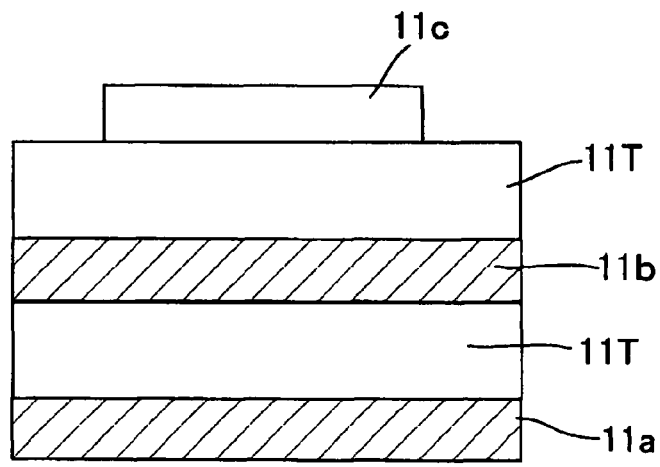

In Embodiment 2, the terminal structure of a portion corresponding to the third electrode terminal 15 shown in FIG. 5(a) in Embodiment 1 will be described. While the first through third electrode terminals are formed on the uppermost layer of the first substrate 11 in Embodiment 1, a third electrode terminal 15S is composed by a second conductor layer 11b exposed into a concave part on the first substrate 11 as shown in FIG. 6(b) in this embodiment. In other words, in Embodiment 2, a third conductor layer 11c constituting the third layer wiring of the substrate equivalent to the first substrate and an insulating layer 11T below (including a film carrier) are removed and a concave part is formed with the second conductor layer 11b exposed therein constituting the third electrode terminal 15S.

For manufacturing, as shown in FIG. 6(a), a laminated substrate including the first through third conductor layers 11a through 11c laminated via the insulating layers 11T is subjected to etching through photolithography to expose the second conductor layer. Or, substrates may be laminated with the conductor layer on the film carrier previously patterned.

Figure 7:
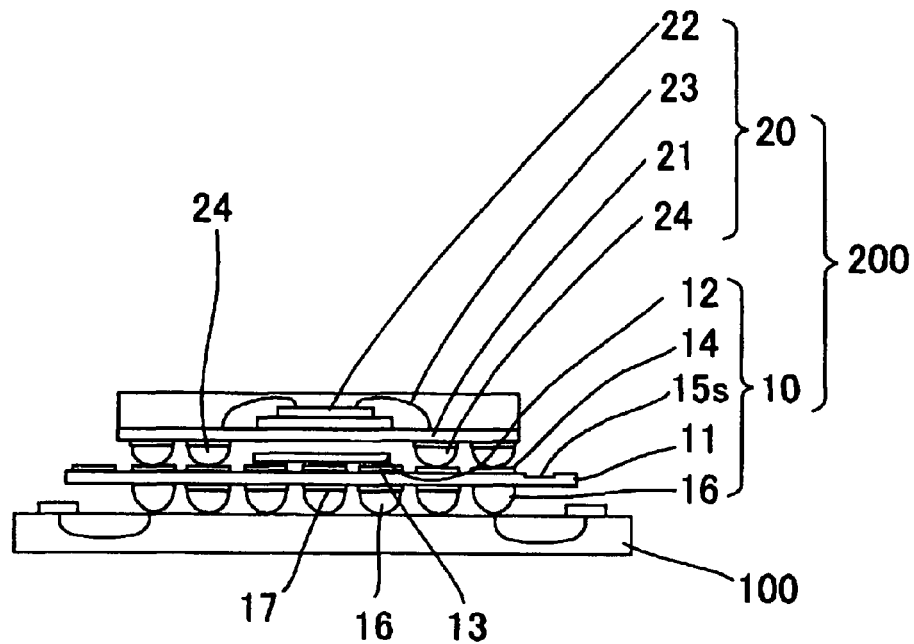
FIG. 7 shows the key parts of a substrate according to Embodiment 3 of the invention.
Figure 7:
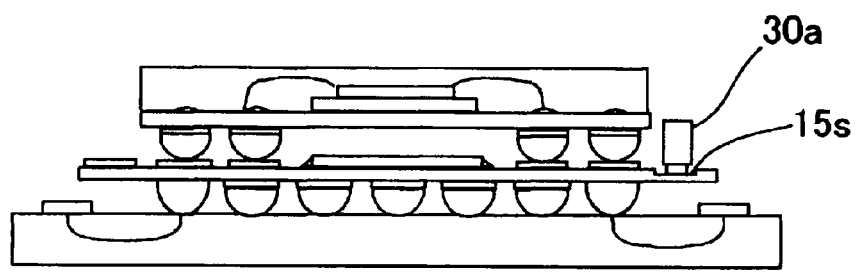

FIGS. 7(a) and 7(b) show a circuit module using the third electrode terminal having the structure of this embodiment 2 and the circuit module having an electronic component such as a filter 30a mounted thereon. In this semiconductor device, the third electrode terminal 15S on the first substrate is composed of the second conductive layer 11b exposed in a concave part formed with the third conductor layer 11c constituting the third layer wiring and the insulating layer 11T below (including a film carrier) removed. Otherwise the circuit module is similar to that in Embodiment 1 shown in FIGS. 1 and 4.

With this configuration, a probe is received by the concave part in case one is used for inspection. This facilitates positioning and assures good contact.

Positioning is made easy also in case a component such as a filter of a bypass capacitor is mounted, thus enhancing the mounting workability.

As shown in FIG. 6(c), it is possible to form a third electrode terminal on the third conductor layer 11c of the uppermost layer. In this case, positioning is not easy but the wiring length may be reduced so that the signal characteristics are enhanced.

While a laminated substrate of a three-layer structure is used in this embodiment, a laminated substrate of a multilayer structure having multiple wiring layers may be used such as a laminated substrate of a five-layer employed in Embodiment 1.

Embodiment 3

Embodiment 3 of the invention will be described.

In Embodiment 3, a variation will be described having a terminal structure with a change in the arrangement of the third electrode terminal 15 on the first substrate shown in FIG. 1(b) in Embodiment 1. While the third electrode terminals 15 arranged on the perimeter on the first substrate 11 are formed with a constant pitch and in the same size in Embodiment 1, the third electrode terminals 15 include, as shown in FIGS. 8(a) and 8(b), third electrode terminals 15G for grounding formed by a single large-area region and a regular-area region formed with a constant pitch, third electrode terminals 15v for power source formed by a single large-area region, and third electrode terminals 15s for regular signal extraction. FIG. 8(b) is an enlarged explanatory drawing of a region enclosed by alternate long and short dashed lines in the corner part of FIG. 8(a). In this example, all the third electrode terminals 15 are formed as the same and connection is made via the internal wiring (conductor layer) of the first substrate 11 so as to connect to the second electrode terminals arranged in two rows on the inner periphery or wire bonding is made alternately on the inner and outer sides to provide electrical connection in a zigzag fashion.

With this configuration, even in the presence of a large number of pins on a ground terminal, a through via does not reduce the mounting area on the rear surface of a substrate or the surface on which an integrated circuit is not mounted. While measurement using a differential probe is difficult when a signal is distant from a ground terminal, measurement is made easy in this example because the ground terminal is located in an area close to the signal terminal. An increase in the inductance caused by an increase in the distance in the direction of thickness of a substrate is minimized. In this way, it is possible to appropriately arrange a power source and grounding thus reducing variations in the characteristics.

Embodiment 4

Embodiment 4 of the invention will be described.

Figure 9:
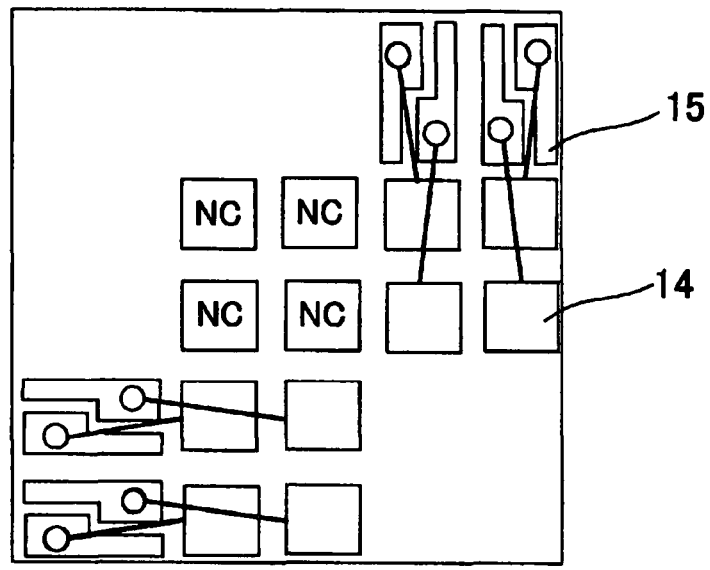
FIG. 9 shows the key parts of a substrate according to Embodiment 4 of the invention.
Figure 10:
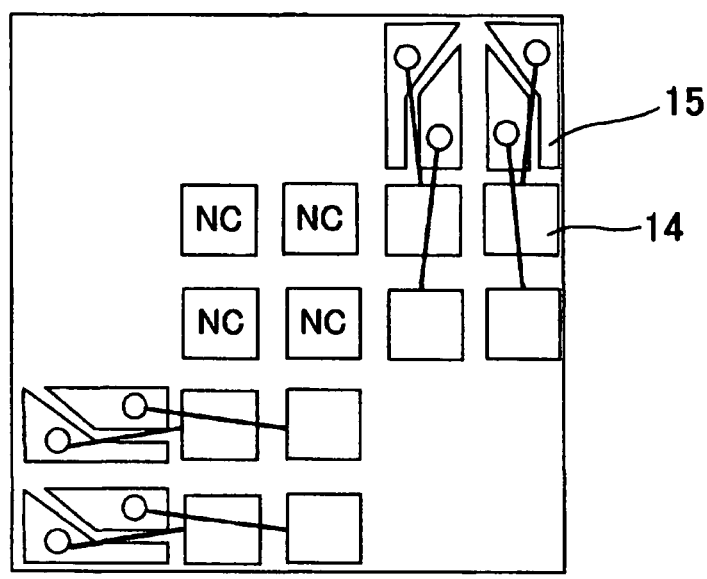
FIG. 10 shows the key parts of a substrate according to Embodiment 4 of the invention.
Figure 11:
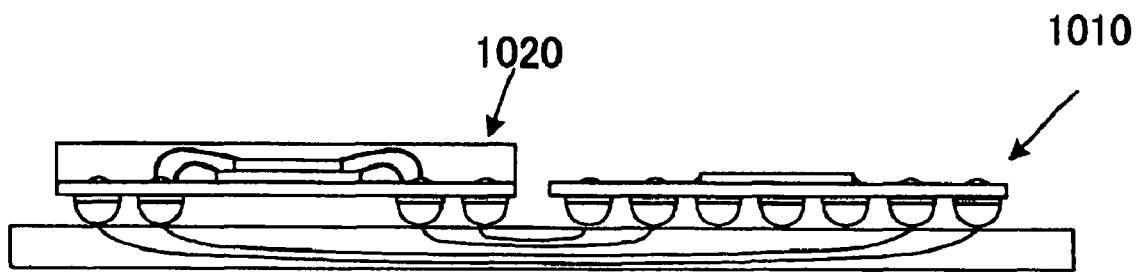
FIG. 11 shows a circuit module according to the related art.
Figure 12:
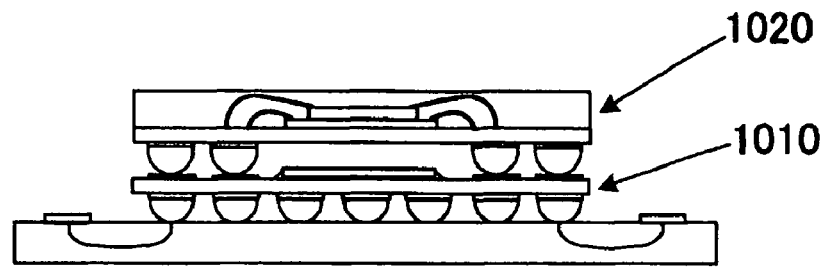
FIG. 12 shows a circuit module according to the related art.

In Embodiment 4, a variation of the shape of the third electrode terminal 15 will be described. While the third electrode terminals 15 are arranged in the same shape in Embodiment 3, irregular shapes and spacing are employed and a marker is formed so as to discriminate between signals in this embodiment. As shown in FIGS. 9 and 10, the shape of the third electrode terminal 15 alternates between an odd-numbered electrode terminal and an even-numbered electrode terminal.

In this example, two adjacent third electrode terminals 15 are in complementary shapes or equivalent shapes and horizontally non-symmetrical as mentioned above. In this example also, connection is made via the internal wiring (conductor layer) of the first substrate 11 so as to connect to the second electrode terminals 14 arranged in two rows on the inner periphery of the third electrode terminal 15 or wire bonding is made alternately on the inner and outer sides to provide electrical connection in a zigzag fashion.

With this arrangement, shape and spacing are intentionally changed on a regular basis and a marker is formed thus reducing variations in the characteristics.

In this way, the first and second substrates 11, 21 are used as integrated circuit mounting substrates if the circuit module 200.

In this configuration, a signal from the second integrated circuit 22 as a memory is extracted from the third electrode terminal 15 on the perimeter of the first substrate 11 in the lower layer via the second electrode terminal 14 of the substrate 11.

The first substrate 11 and the second substrate are formed by patterning a copper foil bonded to a resin film as a film carrier and laminating and fixing the film carriers.

The first and second substrates 11, 21 includes the conductor layers 11a, 11b, 11c constituting patterns of a ground layer, a power source layer and a wiring layer are sandwiched between the insulating layers 11T and wiring patterns constituting a connecting electrode pad arranged on its front surface and rear surface, the patterns electrically connected through the via hole H formed in the insulating layer 11T. Boring of the via hole may be made through laser machining, drill-based machining or die-based machining. Laser machining is preferable since it is capable of forming a through hole with a minute pitch without generating shavings. Laser machining is made easy by the use of a $CO_2$ laser or an excimer laser. For electrical connection, electroless plating may be used or a conductive material may be filled.

While the conductor layers 11a, 11b, 11c constituting a wiring pattern, a ground layer and a power source layer are made of a copper foil, the invention is not limited thereto but a substance with electric continuity such as a conductive resin compound may be used. For example, in case a copper foil is used as a wiring pattern, a copper foil about 12 to 35 micrometers thick prepared through electroplating may be applicable. A copper foil preferably has a coarse surface that is in contact with an insulating layer in order to enhance bonding to the insulating layer. As a copper foil, coupling processing on the foil surface or tin, zinc or nickel plating on the copper foil surface may be used in order to enhance bonding and resistance to acid. The metallic layer may be a lead frame of a metallic board formed through etching or blanking. When a lead frame is used, a green sheet is separately formed per unit and fixed on the lead frame through a printing method or the like. Components are mounted as required. Then an insulating layer of the next layer and a conductor layer of the next layer, . . . are laminated in order, and the resulting green sheet is finally divided into laminated substrates constituting the unit thus forming substrates with ease.

The first and second substrates 11, 21 may be formed in the following way. For example, composite sheets or so-called green sheets made of a mixture including an inorganic filler and a thermosetting resin are subjected to boring for circuit components or a conductive channel as required and are laminated in a non-hardened state, followed by drying and hardening at a temperature of 200° C. Obtained are laminated substrates each including a circuit component and a conductive channel. Holes for components or conductive channels may be made through laser machining, drill-based machining or die-based machining. Laser machining is preferable since it is capable of forming a through hole with a minute pitch without generating shavings. Laser machining is made easy by the use of a $CO_2$ laser or an excimer laser. The holes may be formed at the same time as molding of a mixture to form a green sheet. The inorganic filler may be $AL_2O_3$, MgO, BN, AlN or $SiO_2$. The thermosetting resin may be an epoxy resin with high heat resistance, a phenol resin or a cyanate resin. The epoxy resin is especially preferable with its high heat resistance. The mixture may further include a dispersant, a coupling agent or a release agent.

In case a mixture of an inorganic filler and a thermosetting resin is used as a material of an insulating sheet, baking at a high temperature is not required unlike a ceramic substrate but the substrate is formed through drying at about 200° C., which means that manufacturing is made easy.

By selecting an inorganic filler used for an insulating sheet, it is possible to readily control the linear expansion coefficient, thermal conductivity and permittivity of an insulating sheet. Setting the linear expansion coefficient of an insulating sheet almost equal to that of a semiconductor element can prevent cracks caused by a change in temperature, thereby providing a reliable substrate. Enhancing the thermal conductivity of an insulating sheet obtains a reliable integrated circuit mounting substrate even in the presence of highly packed circuit components.

The first and second semiconductor integrated circuit chips used in the foregoing embodiments are not limited to a memory but may be applied to various types of functional elements.

The substrate according to the invention is designed to be resistant to noise and is thus applicable to various applications such as a high-frequency circuit.

What is claimed is:

1. A laminated semiconductor device comprising:
   a substrate mounting a first semiconductor integrated circuit; and
   an upper substrate mounting a second semiconductor integrated circuit, wherein:
   said substrate includes therein a plurality of conductor layers laminated via insulating layers,
   said substrate includes on its upper surface:
      a first electrode terminal connected to said first semiconductor integrated circuit,
      a second electrode terminal connected to a terminal on the upper substrate, and
      a third electrode terminal located outside the outer edge of said upper substrate, on at least part of the perimeter of said first and second electrode terminals,
   said substrate includes a fourth electrode terminal located on said substrate on a surface opposite to a surface on which said first to third electrode terminals are formed, and
   said upper substrate is electrically connected to said third electrode terminal as an inspecting terminal via said second electrode terminal.

2. The semiconductor device according to claim 1, wherein the fourth electrode terminal is connected to a lower substrate arranged in a layer below the substrate.

3. The semiconductor device according to claim 1, wherein said third electrode terminal is an electrode pad formed in a row across the peripheral edge of said substrate.

4. The semiconductor device according to claim 1, wherein no portion of the third electrode terminal is located under the upper substrate.

5. The semiconductor device according to claim 1, wherein the upper substrate is inspected via the second and third electrode terminals.

6. The semiconductor device according to claim 1, wherein the third electrode terminal is open to an external terminal so that an inspecting probe is applied to the third electrode terminal.

7. The semiconductor device according to claim 2, wherein said fourth electrode terminal is a solder ball.

8. The semiconductor device according to claim 2, wherein the third electrode terminal is not connected to the lower substrate.

9. The semiconductor device according to claim 3, wherein said third electrode terminal has a portion with a narrower pitch than said second connection terminal.

10. The semiconductor device according to claim 3, wherein said third electrode terminal has a region integrally connected across a plurality of pitches.

11. A method for inspecting a semiconductor device comprising steps of:
    preparing the semiconductor device, wherein the semiconductor device includes:
       a substrate mounting a first semiconductor integrated circuit; and
       an upper substrate mounting a second semiconductor integrated circuit, wherein
       said substrate includes therein a plurality of conductor layers laminated via insulating layers, said substrate includes on its upper surface:
       a first electrode terminal connected to said first semiconductor integrated circuit,
       a second electrode terminal connected to a terminal on the upper substrate, and
       a third electrode terminal located outside the outer edge of said upper substrate, on at least part of the perimeter of said first and second electrode terminals,
       a fourth electrode terminal located on said substrate on a surface opposite to a surface on which said first to third electrode terminals are formed, and
       said upper substrate is electrically connected to said third electrode terminal as an inspecting terminal via said second electrode terminal; and
    inspecting said substrate mounting said first semiconductor integrated circuit by causing a probe to come into contact with said third electrode terminal on said first substrate.

12. A method for manufacturing a semiconductor device according to claim 11, wherein the upper substrate is fixed the second semiconductor integrated circuit so as to establish electrical connection via said second electrode terminal on said upper substrate determined acceptable in said inspecting step.

13. A method for manufacturing a semiconductor device comprising steps of:
    preparing the semiconductor device, wherein the semiconductor device includes:
    a substrate mounting a first semiconductor integrated circuit; and
    an upper substrate mounting a second semiconductor integrated circuit, wherein:
    said substrate includes therein a plurality of conductor layers laminated via insulating layers, said substrate includes on its upper surface:
    a first electrode terminal connected to said first semiconductor integrated circuit,
    a second electrode terminal connected to a terminal on the upper substrate, and
    a third electrode terminal located outside the outer edge of said upper substrate, on at least part of the perimeter of said first and second electrode terminals,
    a fourth electrode terminal located on said substrate on a surface opposite to a surface on which said first to third electrode terminals are formed, and
    said upper substrate is electrically connected to said third electrode terminal as an inspecting terminal via said second electrode terminal; and
    inspecting said upper substrate mounting said second semiconductor integrated circuit by causing a probe to come into contact with the third electrode terminal on said first substrate.

* * * * *